United States Patent [19]

Barjonnet et al.

[11] Patent Number: 5,475,558
[45] Date of Patent: Dec. 12, 1995

[54] ELECTRICAL POWER DISTRIBUTION DEVICE WITH ISOLATION MONITORING

[75] Inventors: Jean-Paul Barjonnet, Meylan; François Vincent, Grenoble, both of France

[73] Assignee: Merlin Gerin, France

[21] Appl. No.: 307,448

[22] Filed: Sep. 21, 1994

Related U.S. Application Data

[63] Continuation of Ser. No. 906,652, Jun. 30, 1992, abandoned.

[30] Foreign Application Priority Data

Jul. 9, 1991 [FR] France ................................ 91 08715

[51] Int. Cl.⁶ ........................................................ H02H 3/00
[52] U.S. Cl. .................................................. 361/64; 361/81
[58] Field of Search ........................... 361/62–66, 69, 361/81, 102, 71

[56] References Cited

U.S. PATENT DOCUMENTS 4,245,318  1/1981  Eckart et al. ......................... 364/481
4,791,520  12/1988  Stegmuller ............................. 361/63
4,873,601  10/1989  Wakasa ................................... 361/64
4,972,290  12/1990  Sun et al. ............................... 361/64
4,996,646  2/1991  Farrington ............................. 361/71
5,066,920  11/1991  Suptitz ................................... 324/544

Primary Examiner—A. D. Pellinen
Assistant Examiner—Ronald W. Leja
Attorney, Agent, or Firm—Parkhurst, Wendel & Rossi

[57] ABSTRACT

An electrotechnical power supply system includes several power sources and interconnectable feeders, and an overall isolation monitor and at least one locator on each power source.
All the overall isolations monitors and locators are connected together by a local data bus transmission network.
A plurality of connecting circuit breakers are arranged between the power sources. A management unit is electrically connected to the transmission network for transmitting control signals to the overall isolation monitors, so as to switch some of the monitors to an inaction excluded mode, with the exception of a single one of them which operates as pilot in an active mode.

3 Claims, 3 Drawing Sheets

ELECTRICAL POWER DISTRIBUTION DEVICE WITH ISOLATION MONITORING

This is a continuation of application Ser. No. 07/906,652 filed Jun. 30, 1992, now abandoned.

BACKGROUND OF THE INVENTION

The invention relates to an electrical power distribution installation with isolation monitoring. The document FR-A-2,647,220 describes an electrical power distribution installation which comprises a single three-phase A.C. power supply system with isolated neutral. The power supply system is equipped with a digital overall isolation monitor which inputs an auxiliary A.C. voltage called input voltage, of a frequency generally comprised between 4 and 10 Hertz, to the power supply system.

In the event of an isolation fault occurring, the overall isolation monitor measures, by means of a conventional synchronous demodulation process, the values of the leakage resistance and leakage capacitance which are due to the fault. Determination is achieved by prior measurement of the input voltage and of the leakage current in the leakage impedance due to the fault.

An improvement of the device consists in providing, on each branch line, or feeder, of the three-phase power supply system, a current measuring toroid which is connected to a local isolation monitor, called locator. The locator operates in the same way as the overall isolation monitor, i.e. by synchronous demodulation, but the value of the input voltage Ui which it. uses is transmitted to it directly by the overall isolation monitor, whereas the value of-the local leakage current is naturally measured by the measuring toroid or toroids which equip the branch or branches of the feeder.

The overall isolation monitor also transmits to each locator synchronization pulses of the reference sine waves which are used by the synchronous demodulation.

In the case, concerned by the present invention, where the electrotechnical installation comprises several distinct power distribution systems, each having an overall isolation monitor, it is necessary to avoid having a configuration such that several overall isolation monitors are in operation at the same time on the same feeders, which would result in an impossibility of using the monitors. The conventional technique which can be used to overcome this difficulty would consist in providing a set of relays, with extremely complex circuitry, to disconnect certain overall isolation monitors when this proves necessary due to the configurations used. This solution has the shortcoming of being particularly complicated and costly.

SUMMARY OF THE INVENTION

The object of the present invention is to overcome this drawback. It refers to an electrical power distribution device comprising:

several power supply sources, each associated with an overall isolation monitor, each source supplying by means of a busbar a plurality of feeders via at least one circuit breaker, said overall isolation monitor being arranged to measure the leakage resistance by synchronous demodulation of the input voltage and leakage current;

a local device, arranged in .each feeder, for measuring the leakage current intensity, said device notably comprising a ground fault toroid;

a local isolation monitor or locator connected to the measuring devices of the feeders associated with each power supply source, each locator receiving a local measurement of the leakage current in each feeder;

a computer line connecting each overall isolation monitor to each associated locator;

a plurality of connecting circuit breakers arranged between the power supply sources to achieve a predetermined electrotechnical configuration, characterized in that the set of computer lines forms a single local transmission network, and that means for measuring, computing, and actuating, are provided to generate and to collect data representative of the open or closed state of each of said circuit breakers and to transmit, via the local network, exclusion orders to the overall isolation monitors which are, depending on the electrotechnical configuration of each portion of installation supplied, on the same configuration, with the exception of a single one of them which operates as pilot on said portion after transmission of the information to all the locators of the portion via said local network

BRIEF DESCRIPTION OF THE DRAWINGS

Anyway, the invention will be fully understood and its advantages and other features become more clearly apparent from the following description of two illustrative embodiments, given as non-restrictive examples only, with reference to the accompanying schematic drawing in which.

DESCRIPTION OF THE PREFERRED EMBODIMENT

Figure 1:
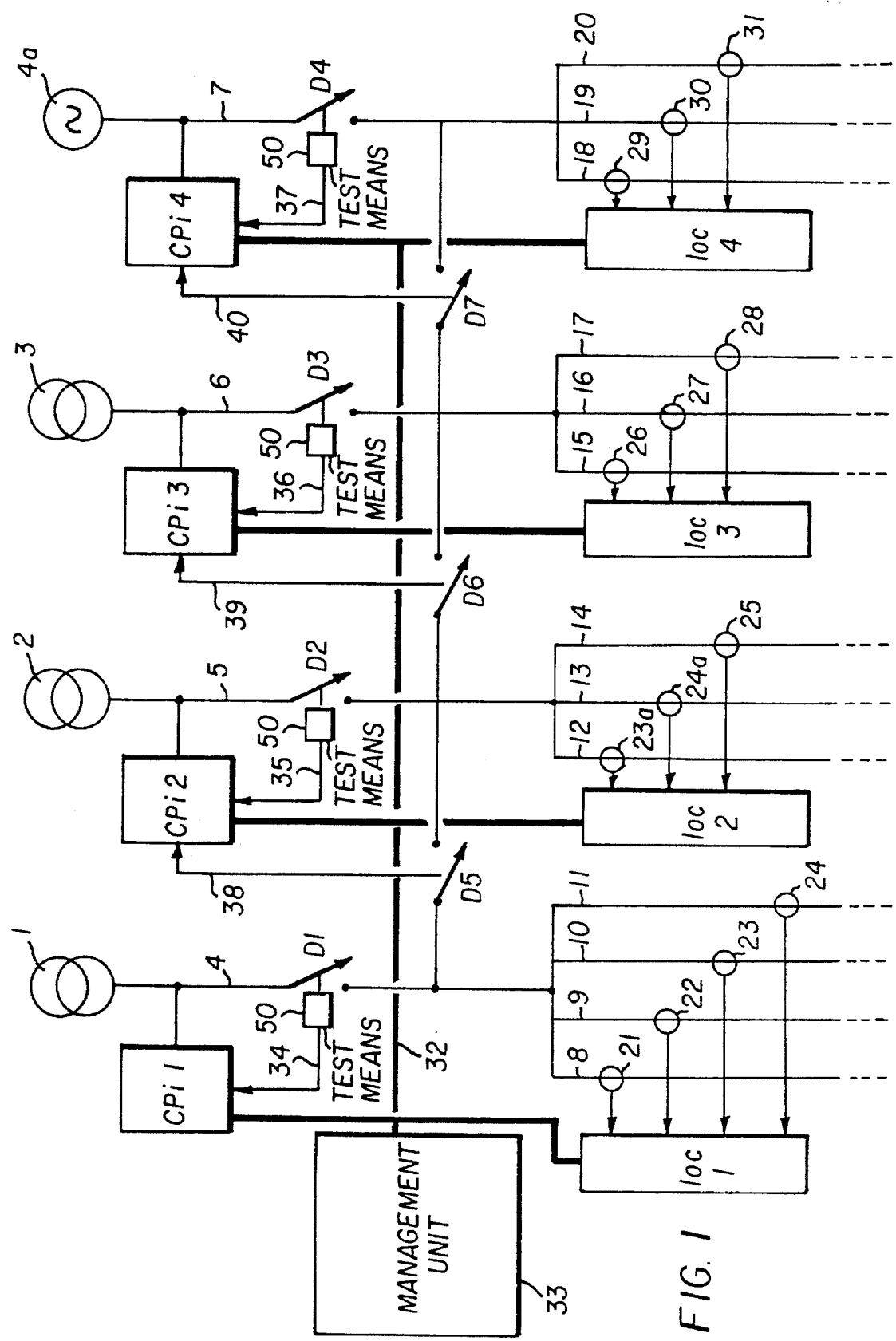
FIG. 1 is a block diagram of the installation in a general case.

Referring to FIG. 1, an electrotechnical installation for supply of three-phase A.C. electrical power with isolated neutral is represented. In this example, the electrotechnical installation comprises three distinct power supply sources 1, 2, 3, each feeding a busbar, respectively 4, 5, 6, and an electricity generator 4a feeding a busbar 7. Each busbar 4 to 7 is normally designed to supply, via a respective circuit breaker D1 to D4, its own electrotechnical configuration which is formed, in this relatively simple example, by a certain number of branch lines, or feeders:

feeders 8 to 11 for busbar 4;

feeders 12 to 14 for busbar 5;

feeders 15 to 17 for busbar 6; and feeders 18 to 20 for busbar 7.

In addition, the four elementary configurations can, depending on requirements, be interconnected via connecting circuit breakers D5, D6, and D7.

Finally, each of the four elementary configurations is fitted with a digital isolation monitoring device, the same for each of them, and comprising for example for the first elementary configuration (1, 4, 8 to 11):

an overall isolation monitor CPI1, for example like the one described in the above-mentioned document FR-A-2,647,220, which is connected to the busbar 4 between the power supply system 1 and circuit breaker D1. The monitor CPI1 measures the leakage resistance by synchronous demodulation of its input voltage Ui and leakage current If; and a local isolation monitor LOCI, or locator, which receives a local measurement of the leakage current in each of the feeders 8 to 11 by means of ground fault measuring toroids 21 to 24, and which computes, again by synchronous demodulation, the local leakage impedance using both the local measurement and the measurement of the input voltage Ui which is transmitted to it by the overall isolation monitor CPI1 via a computer line 32.

The same is the case for the other three above-mentioned elementary configurations (see toroids 23 to 31 and locators LOC2 to LOC4), and in fact the computer line 32 constitutes a local network which connects together all the overall isolation monitors CPI1 to CPI4 and all the locators LOC1 to LOC4. In addition, the local network 32 connects the eight devices to a central management unit 33.

In addition, each circuit breaker D1 to D7 is equipped with test means 50, formed for instance by a conventional auxiliary microcontact, which is able to communicate, via a respective electrical line 34 to 40, information representative of its open or closed state to one of the isolation monitors CPI1 to CPI4, so that this state can be transmitted, via the local network 32, to the management unit 33.

So long as the four above-mentioned elementary configurations are operating separately, i.e. if all the interconnecting circuit breakers D5 to D7 are open, no particular difficulties arise. The isolation monitoring system can on the other hand no longer operate if several of the elementary configurations are interconnected, for example the first three if circuit breakers D5 and D6 are closed, due to the fact that the overall isolation monitors, CPI1 to CPI3 in this example, then electrically inter-connected, would input to one another.

To overcome this shortcoming, the management unit 33 then switches the overall isolation monitors CPI2 and CPI3, via the local network 32, to switch to excluded mode, i.e. they no longer input anything. The only remaining overall isolation monitor is the monitor CPI1 which operates as pilot by input of the voltage Ui to all of the three elementary configurations and by transmission of the demodulated voltage data to all the locators LOCI to LOC3 of the system.

Naturally, the remaining configuration 4,7,18 to 20, which remain independent due to the fact that the connecting circuit breaker D7 is open, continues operating alone with its two monitors CPI4 and LOC4.

Figure 2:
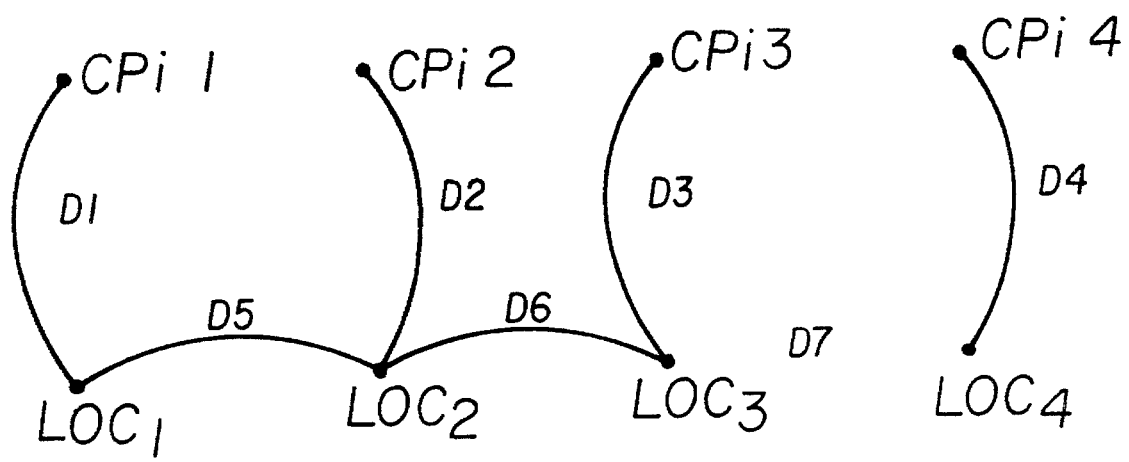
FIG. 2 is a representation of a graph used for management of the installation according to FIG. 1.

The management unit 33 proceeds by means of graphs, an example of which is represented in FIG. 2 for the electrical configuration described above (circuit breakers D1 to D6 closed, circuit breaker D7 open).

On this graph, the devices CPI1 to CPI4, LOC1 to LOC4, are peaks, whereas the circuit breakers D1 to D7 are arcs. An arc exists if the corresponding circuit breaker is closed, and does not exist in the opposite case.

The above-mentioned electrical configuration then gives the graph represented in FIG. 2, which clearly shows the unit 33 that the three monitors CPI1 to CPI3 are on one and the same configuration, so that two of them should be switched to excluded mode, the last one being the pilot. The choice of pilot is made by the unit 33 according to a preset program, and the unit 33 gives the input or exclusion orders to all the CPI and, for each locator, the address of the pilot monitor.

Figure 3:
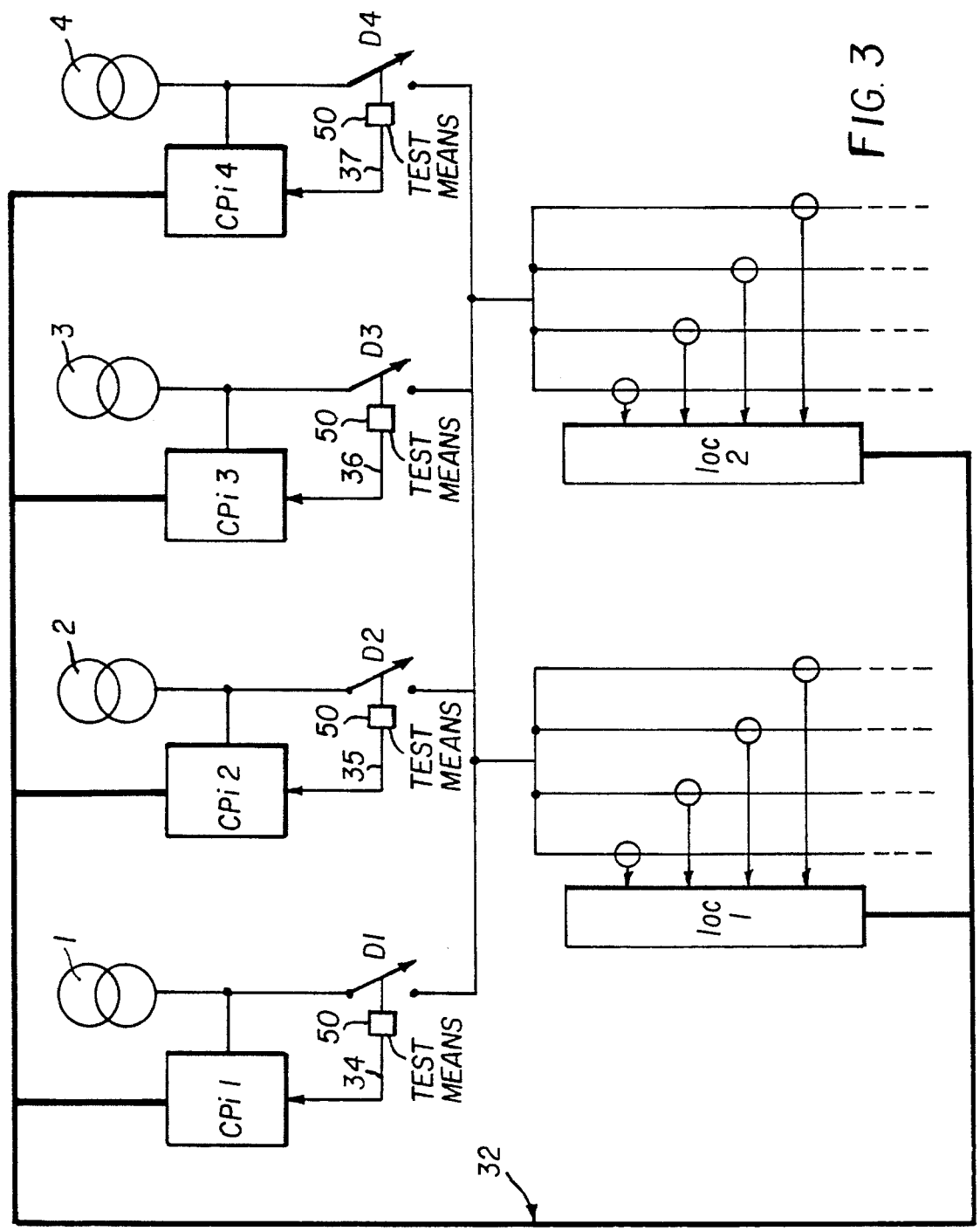
FIG. 3 represents, in the same way as in FIG. 1, an installation of the same type, but in a very simplified configuration.

In the case of very simple electrotechnical configurations, such as for example the one represented in FIG. 3, comprising for example four overall isolation monitors CPI1 to CPI4 and four circuit breakers D1 to D4, the management unit is not necessary.

The operating mode of each monitor CPI1, CPI2, CPI3, CPI4 is determined by the monitor itself according to the state of the contact of the circuit breaker D1, D2, D3, D4. If the contact is open, the corresponding monitor CPI inputs but does not send the voltage Ui to the locators. If the contact is closed, and depending on the address code proper to each device and necessary for good communications on the computer line 32, each monitor decides whether it becomes pilot or excluded. The device having the smallest address becomes pilot, and the others become excluded.

We claim:

1. An electrical power distribution system comprising:

several power supply sources and an overall isolation monitor corresponding to each of the power supply sources, wherein each power supply source supplies a plurality of feeders via at least one circuit breaker, each overall isolation monitor being arranged to measure the leakage resistance of a portion of said distribution system by synchronous demodulation of an input voltage and leakage current;

a plurality of local measuring devices corresponding to the plurality of feeders, wherein each local measuring device measures the leakage current intensity in its corresponding feeder, and each of said local measuring devices comprise a ground fault toroid;

a plurality of local isolation monitors, wherein each local isolation monitor is connected to a group of the local measuring devices, and wherein each local isolation monitor receives a local measurement of the leakage current in each feeder corresponding to each of the local measuring devices in the group of local measuring devices connected to the local isolation monitor;

data transmission network means for transmitting data, wherein each of said overall isolation monitors and each of said local isolation monitors are connected to the data transmission network means;

a plurality of connecting circuit breakers arranged between the power supply sources to achieve a predetermined electrotechnical configuration with different supplied portions of said system;

test means for generating first data signals representative of the open or closed state of each of said circuit breakers and supplying the first data signals to said overall isolation monitors; and a management unit, connected to said transmission network means, for receiving the first data signals and for transmitting second control signals via the transmission network means to the overall isolation monitors, so as to switch some of the overall isolation monitors of a supplied portion to an inactive excluded mode, while leaving one overall isolation monitor to operate in an active mode as a pilot monitor on said supplied portion, and for indicating the pilot monitor to all the local isolation monitors.

2. The distribution system according to claim 1, wherein the management unit includes graphing means wherein the graphing means generates graphs including peaks formed by the overall monitors and arcs connecting or not connecting these peaks according to the open or closed state of the circuit breakers, each circuit breaker being shown by an arc.

3. The distribution system according to claim 1, wherein each overall isolation monitor acts as a management unit able to decide its own operation or its exclusions from the other overall isolation monitors.

* * * * *